United States Patent [19]

Krenik et al.

[11] Patent Number: 4,887,048
[45] Date of Patent: Dec. 12, 1989

[54] DIFFERENTIAL AMPLIFIER HAVING EXTENDED COMMON MODE INPUT VOLTAGE RANGE

[75] Inventors: William R. Krenik, Dallas; Wei-chan Hsu, Plano; Richard Nail, Dallas, all of Tex.

[73] Assignee: Texas Instruments Incorporated, Dallas, Tex.

[21] Appl. No.: 146,441

[22] Filed: Jan. 21, 1988

[51] Int. Cl.$^4$ .............................................. H03F 3/45
[52] U.S. Cl. ...................................... 330/258; 330/261
[58] Field of Search ............... 330/252, 253, 257, 258, 330/259, 260, 261, 288

[56] References Cited

U.S. PATENT DOCUMENTS 4,766,394  8/1988  Yukawa ............................... 330/258

*Primary Examiner*—Gene Wan

*Attorney, Agent, or Firm*—B. Peter Barndt; James T. Comfort; Melvin Sharp

[57] ABSTRACT

A differential amplifier (10) having a circuit (18) which images or simulates the bias current flowing in an input stage (34) of the differential amplifier (10) is disclosed. This image circuit (18) resembles a differential amplifier input stage, couples to the signal inputs (28, 30) of the differential amplifier (10), and provides an output signal that reflects such bias current. One embodiment of the present invention feeds this output signal back to the differential amplifier input stage (34) to improve regulation of a constant current source (26). Another embodiment uses this signal to switch current from an external source (86) to the differential amplifier input stage (34) when a constant current source (26) within the differential amplifier input stage (34) fails to maintain a constant current supply.

33 Claims, 2 Drawing Sheets

DIFFERENTIAL AMPLIFIER HAVING EXTENDED COMMON MODE INPUT VOLTAGE RANGE

TECHNICAL FIELD OF THE INVENTION

The present invention relates generally to linear integrated circuits. More specifically, the present invention relates to circuitry for extending the common mode input voltage range of differential amplifiers.

BACKGROUND OF THE INVENTION

Common mode rejection ration (CMRR) and common mode input voltage range (CMIVR) are two of many parameters which characterize an operational or differential amplifier. Ideally, a differential amplifier will respond only to differences between two input voltages. However, practical devices also respond to the absolute magnitude of input signals. The CMRR characterizes a differential amplifier's ability to refrain from responding to this absolute magnitude. Furthermore, an ideal differential amplifier will successfully receive two input signals of any absolute magnitude and output a signal which corresponds only to the voltage difference between the two input signals. However, practical devices operate successfully only within a limited range of input signal voltages. The CMIVR characterizes the input voltage range over which a differential amplifier will successfully operate. Obviously, a differential amplifier which has both a large CMRR and a large CMIVR is highly desirable.

In conventional differential amplifiers the CMRR and CMIVR parameters are closely related to each other. Techniques are known for improving the CMRR parameter, but such techniques tend to substantially degrade the CMIVR parameter. For example, conventional differential amplifiers utilize a "nearly-constant" current source which couples to the emitters (or sources) of transistors whose bases (or gates) receive the input signals for the differential amplifier. A "perfectly-constant" current source would exhibit an infinitely high impedance and a corresponding CMRR would be infinitely large. However, practical devices must operate with only a "nearly-constant" current source which has a finite impedance. It is well known that increasing the impedance of this constant current source will correspondingly increase the CMRR. However, conventional techniques for increasing the impedance of this constant current source decrease the CMIVR parameter.

Consequently, a need exists for a differential amplifier design which permits the CMRR parameter and the CMIVR parameter to be independent from one another so that both a high CMRR and a high CMIVR may be achieved.

SUMMARY OF THE INVENTION

Accordingly, it is an advantage of the present invention that circuitry is provided which may be added to a differential input stage of an amplifier to extend the common mode input voltage range of the amplifier.

Another advantage of the present invention is that circuitry is provided which enhances the common mode rejection ratio of a differential amplifier without reducing the differential amplifier's common mode input voltage range.

Yet another advantage of the present invention is that circuitry is added to a differential amplifier which permits high precision and low distortion of amplified signals without degrading common mode rejection ratio or common mode input voltage range parameters.

The above and other advantages of the present invention are carried out in one form by a differential amplifier circuit which includes two current supply sources coupled to first nodes of two active devices. Control nodes of the two active devices serve as inputs to the differential amplifier. Second nodes of the two active devices couple together. In addition, the differential amplifier includes a modeling circuit which couples to the control nodes of the active devices and simulates the current flowing through the active devices. Furthermore, a control circuit is coupled between the modeling circuit and at least one of the active devices to maintain a substantially constant current flow through the first and second current supplies.

BRIEF DESCRIPTION OF THE DRAWINGS

A more complete understanding of the present invention may be derived by referring to the detailed description and claims when considered in connection with the accompanying drawings, wherein like reference numbers refer to similar items, and:

DETAILED DESCRIPTION OF THE PREFERRED EMBODIMENTS

Figure 1:
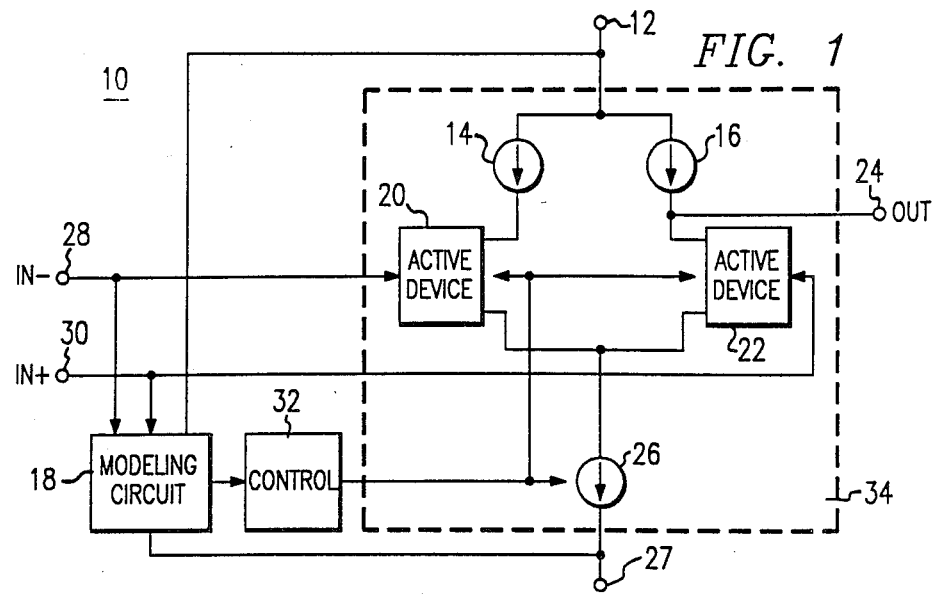
FIG. 1 shows a simplified block diagram of the present invention.

The simplified block diagram of the present invention shown in FIG. 1 depicts a differential amplifier 10, which may also be an operational amplifier, comparator, or the like. A terminal 12 which is adapted to receive a positive supply voltage or positive rail couples to inputs of current sources 14 and 16 and to a first input of a modeling circuit 18. An output of current source 14 couples to a first node of an active device 20. Likewise, an output of current source 16 couples to a first node of an active device 22 and to an output terminal 24. A second node of active device 20 couples to a second node of active device 22 and to an input of a nearly-constant current source 26. An output of nearly-constant current source 26 couples to a first output of modeling circuit 18 and to a terminal 27 adapted to receive a negative supply voltage or negative rail. An input terminal 28 provides the negative signal input to differential amplifier 10, and an input terminal 30 provides the positive signal input for differential amplifier 10. Terminals 28 and 30 couple to second and third inputs of modeling circuit 18, respectively, and a second output of modeling circuit 18 couples to an input of an adaptive bias control circuit 32. An output of control circuit 32 couples to at least one of active device 20, active device 22, or nearly-constant current source 26.

Current sources 14, 16, and 26 along with active devices 20 and 22 form a differential input stage 34 of differential amplifier 10. Differential input stage 34 represents a conventional differential input stage except for the connections between differential input stage 34 and modeling circuit 18, and between differential input stage 34 and control circuit 32. Nearly-constant current source 26 operates to regulate the sum of currents through current sources 14–16 and active devices 20-22. Typically, a differential input stage is designed so that the bias current through current source 14 approximately equals the bias current through current source 16. The sum of these currents is ideally constant regardless of input voltages applied at terminals 28 and 30. However, practical devices which are employed in the construction of nearly-constant current source 26 have great difficulty in achieving constant current regulation when a common mode voltage applied at terminals 28 and 30 approaches at least one of the negative or positive rails. Consequently, in conventional differential input stages, large magnitude common mode signals substantially influence an output signal provided at terminal 24.

Modeling circuit 18 is provided to model the operation of differential input stage 34. Specifically, modeling circuit 18 simulates or forms an image of the current flowing in differential input stage 34 and provides an output signal which is proportional to current flowing through active devices 20 and 22. Since modeling circuit 18 receives the same input signals as are received by differential input stage 34, modeling circuit 18 receives external conditions, such as large common mode signals, which influence differential input stage 34. As a result, modeling circuit 18 can provide an accurate simulation of differential input stage 34.

Adaptive bias control circuit 32 transforms the output signal from modeling circuit 18 into a form which is suitable for application back into differential input stage 34. Adaptive bias control circuit 32 couples to differential input stage 34 in such a manner that current flow through current sources 14 and 16 is maintained at a substantially constant level in spite of common mode input voltages near the supply rails.

Figure 2:
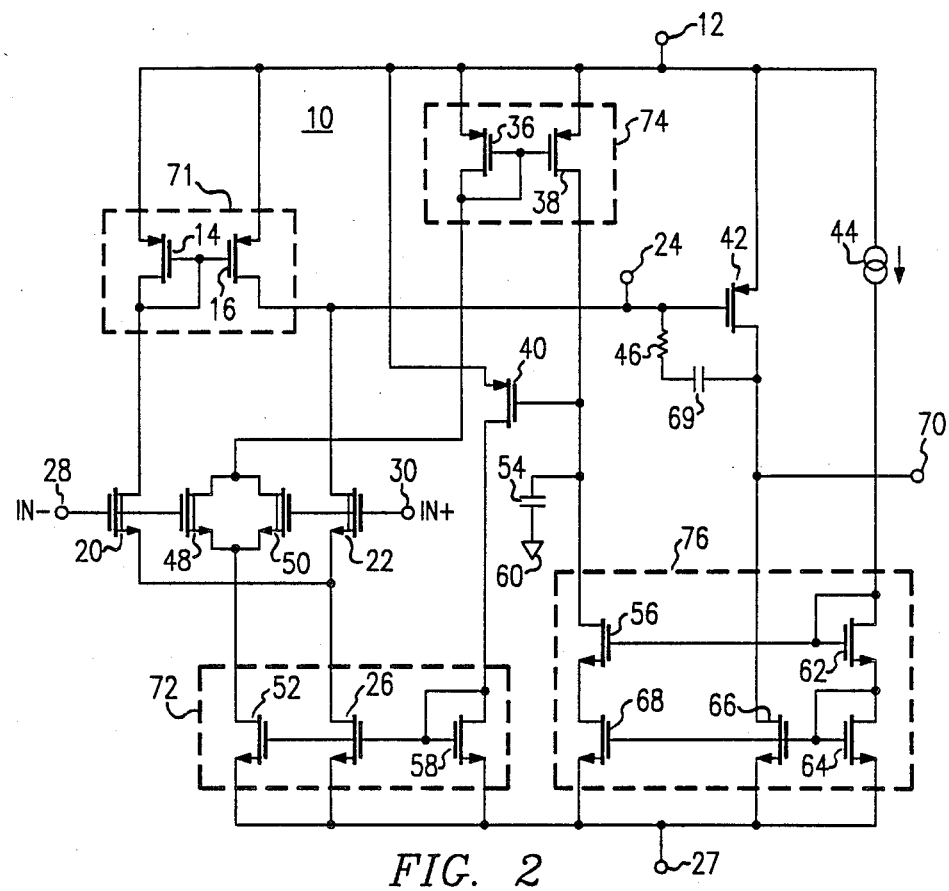
FIG. 2 shows a schematic diagram of a circuit for a first embodiment of the present invention.

FIG. 2 shows a schematic of a first embodiment of the present invention. In this first embodiment of differential amplifier 10, positive terminal 12 couples to sources of P-channel FETs 14 and 16. Active devices 14 and 16 operate as the constant current sources 14 and 16 discussed above in connection with FIG. 1. In addition, terminal 12 couples to sources of P-channel FETs 36, 38, 40, and 42, and to an input of a constant current source 44. A gate of FET 14 couples to a drain of FET 14, a gate of FET 16, and a drain of an N-channel FET 20. A drain of FET 16 couples to a drain of an N-channel FET 22, a gate of FET 42, a first node of a resistor 46, and terminal 24. FETs 20 and 22 operate as active devices 20 and 22 described above in connection with FIG. 1. Thus, a gate of FET 20 couples to a gate of an N-channel FET 48 and to negative signal input terminal 28. Likewise, a gate of FET 22 couples to a gate of an N-channel FET 50 and to positive signal input terminal 30. Sources of FETs 20 and 22 couple together and to a drain of an N-channel FET 26. A source of FET 26 couples to negative terminal 27. Accordingly, FET 26 serves as nearly-constant current source 26 discussed above in connection with FIG. 1. Negative terminal 27 also couples to a source of an N-channel FET 52, and a gate of FET 52 couples to a gate of FET 26. A drain of FET 52 couples to a source of FET 48 and to a source of FET 50. Drains of FETs 48 and 50 couple together, to a drain of FET 36, a gate of FET 36, and a gate of FET 38. A drain of FET 38 couples to a first node of a capacitor 54, a gate of FET 40, and a drain of an N-channel FET 56. A drain of FET 40 couples to a drain of an N-channel FET 58, a gate of FET 58, and the gates of FETs 26 and 52. A source of FET 58 couples to negative terminal 27. A second node of capacitor 54 couples to a terminal 60, which is adapted to operate as an AC ground in differential amplifier 10.

In addition, an output of constant current source 44 couples to a gate of an N-channel FET 62, a drain of FET 62, and a gate of FET 56. A source of FET 62 couples to a gate of an N-channel FET 64, a drain of FET 64, a gate of an N-channel FET 66, and a gate of an N-channel FET 68. Sources of FETs 64, 66, and 68 couple together and to negative terminal 27. A drain of FET 68 couples to a source of FET 56, and a drain of FET 66 couples to a drain of FET 42. A second node of resistor 46 couples to a first node of a capacitor 69. A second node of capacitor 69 couples to the drains of FETs 42 and 66 and to a terminal 70, which provides an output signal from amplifier 10.

FETs 14, 16, 20, 22, and 26 together form differential input stage 34, discussed above in connection with FIG. 1. As discussed above, differential input stage 34 represents a conventional circuit except for certain connections, which in this first embodiment occur at the gates of FETs 20-22 and at the gate of FET 26. In addition, current sources 14 and 16 couple together in FIG. 2 so that a current mirror 71 results. FET 14 provides the input of current mirror 71 and FET 16 provides the output. FETs 52, 26, and 58 together form a current mirror 72. FET 58 is located at the input of current mirror 72, and FETs 26 and 52 provide first and second outputs, respectively. Consequently, input current through FET 58 is proportional to output current through FET 26 and through FET 52. Furthermore, the amount of current flowing through FETs 26 and 52 is controlled by the signal applied at input FET 58.

FETs 36, 48, 50 and 52 together represent modeling circuit 18, discussed above in connection with FIG. 1. Thus, FETs 48 and 50 receive the signal inputs from input terminals 28 and 30 and couple to FET 52, which operates as a nearly-constant current source. Furthermore, FET 36 operates as a current source in a manner similar to that of FETs 14 and 16. FETs 48 and 50 are matched with FETs 20 and 22 using matching techniques which are well known to those skilled in the art. Thus, FETs 48 and 50 experience approximately equivalent voltages and current densities as those experienced by FETs 20 and 22.

On the other hand, a current flowing through FETs 48, 50 and 52 may be less than the current flowing through the differential input stage because FETs 36, 48, 50 and 52 may be sized smaller than the FETs which are included in the differential input stage to conserve space. Nevertheless, a current flowing through FETs 48 and 50 forms an accurate simulation of the current flowing through FETs 20 and 22.

FETs 36 and 38 together form a current mirror 74 having an input at FET 36 and an output at FET 38. Thus, the current output signal from the modeling circuit at FET 36 is mirrored at the output of current mirror 74. In addition, a current mirror 76 is formed from FETs 64, 66, 68, 56, and 62. FETs 56 and 66 provide the outputs of current mirror 76, and FETs 56 and 62 together represent a cascode stage of current mirror 76. The output current at FET 56 of current mirror 76 remains substantially constant at a level determined by constant current source 44 and the relative geometrics of FETs 64 and 68. Extreme negative common mode input signals near the negative supply rail have substantially no influence on this output current. Since the outputs of current mirrors 74 and 76 couple together at the drains of FETs 38 and 56, a current subtracting process takes place. Consequently, the voltage at the gate of FET 40 reflects the difference in currents provided at the outputs of current mirrors 74 and 76. This voltage is converted to a current due to the transconductance of FET 40 and is fed back to the input of current mirror 72. A feedback loop results.

The feedback loop consists of FETs 52, 48, 50, 36, 38, 40, and 58. When a common mode input voltage applied at terminals 28 and 30 approaches the negative rail, current in FET 52 begins to decrease due to a low drain-to-source voltage across FET 52. This decrease in current represents an image or simulation of the current performance of FET 26 in the differential input stage of amplifier 10. This decrease in current is reflected at the gate of FET 40 as a decrease in voltage, and FET 40 increases the amount of current conducted therethrough as a result. Consequently, the bias current applied to the input of current mirror 72 increases, and output currents provided by FETs 52 and 26 of current mirror 72 increase in response. Capacitor 54 is provided for compensation of the feedback loop so that a dominant pole exists at the gate of FET 40, which supplies the most significant portion of transconductance for the feedback loop.

In this first embodiment of the present invention, current mirrors 71 and 74 have approximately a 1:1 input-to-output ratio. Morever, the output provided by FET 52 of current mirror 72 has approximately a 1:1 input-to-output ratio. However, the output provided by FET 26 of current mirror 72 may provide a greater amount of current than that provided at the output of FET 52. As discussed above, a smaller size for active devices in the modeling circuit compared to active devices in the differential input stage permits the modeling circuit to conduct less current while experiencing equivalent current densities to those in the differential input stage so that both a space savings and an accurate simulation result.

FETs 42 and 66 along with resistor 46 and capacitor 69 form an output stage for differential amplifier 10. This output stage represents a conventional typography familiar to those skilled in the art and is not discussed further herein. The cascoding of the output provided by FET 56 of current mirror 76 is provided to improve input offset voltage of differential amplifier 10 by allowing the drain-to-source voltage of FET 68 to more precisely match the drain-to-source voltage of FET 66.

Figure 3:
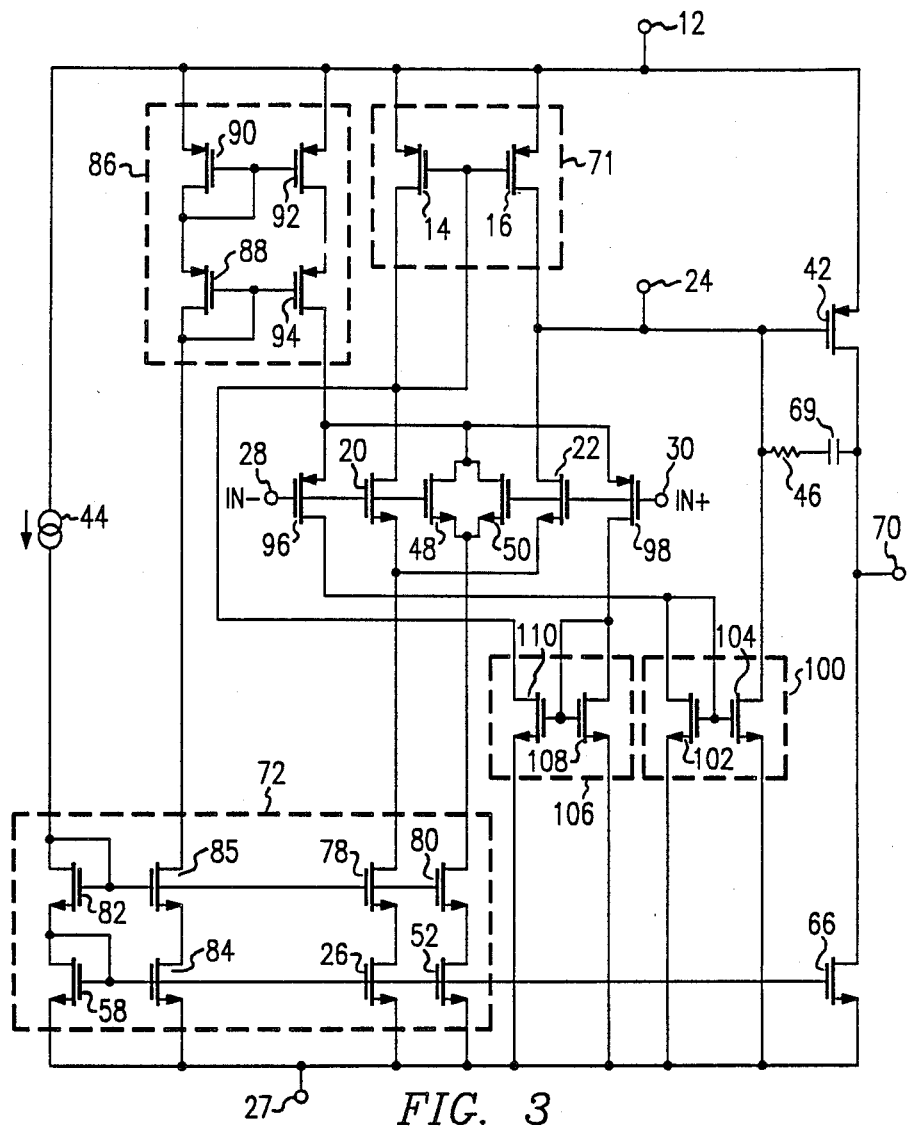
FIG. 3 shows a schematic diagram of a circuit for a second embodiment of the present invention.

A second embodiment of the present invention is shown in FIG. 3. This second embodiment has many features in common with the first embodiment discussed above in connection with FIG. 2. For example, positive terminal 12 couples to sources of P-channel FETs 14 and 16 of current mirror 71. FET 14 is the input of current mirror 71 while FET 16 is the output of current mirror 71. The drain of FET 14 couples to the gate of FET 14, the gate of FET 16, and the drain of N-channel FET 20. The drain of FET 16 couples to the drain of N-channel FET 22, the first node of resistor 46, the gate of P-channel FET 42, and terminal 24. The source of FET 20 couples to the source of FET 22 and, through a cascode stage of current mirror 72 at an N-channel FET 78, to the drain of N-channel FET 26. As discussed above in connection with FIG. 2, the source of N-channel FET 58, the source of FET 26, and the source of N-channel FET 52 all couple to negative terminal 27. In addition, the drain of FET 58 couples to the gate of FET 58 and to the gates of FETs 26 and 52. The drain of FET 52 couples to the sources of N-channel FETs 48 and 50 through the cascode stage of current mirror 72 at an N-channel FET 80. The drains of FETs 48 and 50 couple together, and the gate of FET 48 couples to the gate of FET 20 and to negative signal input terminal 28. Likewise, the gate of FET 50 couples to the gate of FET 22 and to positive signal input terminal 30. The drain of FET 42 couples to the second node of capacitor 69, to the drain of N-channel FET 66, and to output terminal 70. The second node of resistor 46 couples to the first node of capacitor 69. The source of FET 66 couples to negative terminal 27. In this second embodiment of the present invention, the gate of FET 66 couples to the gate of FET 58 rather than as discussed above in connection with FIG. 2, and the drain of FET 58 couples to the output of constant current source 44 through the cascode stage of current mirror 72 at an N-channel FET 82. Gates of FETs 78, 80, and 82 couple together. The input of constant current source 44 couples to positive terminal 12.

Accordingly, the second embodiment of the present invention operates as a differential amplifier, operational amplifier, comparator, or the like, in which a modeling circuit that includes FETs 48, 50, and 52 is coupled to plus and minus signal inputs 30 and 28 of differential amplifier 10. Moreover, FETs 14, 16, 20, 22, 26 and 78 together form the differential input stage of amplifier 10. As discussed above in connection with FIG. 2, the current flowing through the modeling circuit represents an image of the current flowing through the differential input stage. Consequently, when large negative common mode signals are applied at signal input terminals 28 and 30, a current flowing through the image circuit decreases in proportion to the decrease in current flowing through the differential input stage.

However, the second embodiment of the present invention differs from the first embodiment of the present invention in that current mirror 72 provides a third output which is generated by a drain of an N-channel FET 84 coupled through the cascode stage of current mirror 72 at an N-channel FET 85. A source of FET 84 couples to negative terminal 27, and a gate of FET 84 is connected to the gate of FET 58. A gate of FET 85 couples to gates of FETs 78, 80, and 82. This third output of current mirror 72 is connected to an input of a cascoded current mirror 86. Current mirror 86 includes a P-channel FET 88 having a drain and gate coupled together and to the drain of FET 85. A source of FET 88 couples to a drain and a gate of a P-channel FET 90 and to a gate of a P-channel FET 92. A source of FET 90 couples to positive terminal 12. A source of FET 92 couples to positive terminal 12, and a drain of FET 92 couples to a source of a P-channel FET 94. A gate of FET 94 couples to a gate of FET 88, and a drain of FET 94 provides the output from cascoded mirror 86. The output of current mirror 86 couples to sources of P-channel FETs 96 and 98. In addition, the output of current mirror 86 couples to the drains of FETs 48 and 50. Gates of FETs 96 and 98 couple to signal input terminals 28 and 30, respectively. The drain of FET 96 couples to an input of a current mirror 100 at a drain of an N-channel FET 102. The drain of FET 102 couples to a gate of FET 102 and to a gate of an N-channel a FET 104. Sources of FETs 102 and 104 couple to negative terminal 27. A drain of FET 104 provides the output of current mirror 100 and couples to the output of current mirror 71. A drain of FET 98 couples to an input of a current mirror 106 at a drain of an N-channel FET 108. The drain of FET 108 couples to a gate of FET 108 and to a gate of an N-channel FET 110. The sources of FETs 108 and 110 couple to negative terminal 27. The output of current mirror 106 is provided at a drain of FET 110, which couples to the input of current mirror 71.

The second embodiment of the present invention uses the signal output from the modeling circuit to perform a switching function rather than a feedback function as discussed above in connection with the first embodiment of FIG. 2. In this second embodiment, current mirror 72 provides exceptionally well-regulated current at its outputs. FETs 78, 80, 82 and 85 form a cascode stage in current mirror 72 which improves the current regulation and increases the impedance over that of the current mirror 72 shown in FIG. 2. Consequently, the common mode rejection ration (CMRR) is increased due to the improved current regulation. However, the common mode input voltage range (CMIVR) would be degraded due to the inclusion of a cascode stage except that the switching circuitry provided in this second embodiment operates to make these parameters independent from one another.

Current mirror 72 sinks a constant current through FETs 80 and 52. This current is supplied by FETs 48 and 50, which in turn receive current from the output of current mirror 86. The currents at the current mirror 72 outputs provided by FETs 80 and 85 are substantially equal to each other. For purposes of the present discussion, the output current of current mirror 86 may be considered approximately equal to the input current of current mirror 86. Thus, current mirrors 72 and 86 sink and source substantially equal amounts of current. Consequently, so long as FETs 80 and 52 are fully biased to conduct current, substantially the entire amount of current provided at the output of current mirror 86 will be routed through FETs 48 and 50 and through FETs 80 and 52 to negative terminal 27. Almost no current flows through FETs 96 and 98.

However, when large negative common mode input signals are applied at terminals 28 and 30, FETs 80 and 52 begin to turn off due to a low drain-to-source voltage experienced by FETs 80 and 52. This images or simulates the operation of FETs 78 and 26. As FETs 80 and 52 begin to turn off, a current supplied at the output of current mirror 86 is diverted through P-channel FETs 96 and 98. As FETs 96 and 98 begin to conduct, this diverted current is mirrored through current mirrors 100 and 106 back to the drains of FETs 22 and 20, respectively. Consequently, as large negative common mode input signals occur, FETs 20 and 22 may not be able to conduct as much current as they could conduct at less extreme common mode input voltages due to degraded current regulation provided by FETs 80 and 52. However, as FETs 20 and 22 begin to turn off, P-channel FETs 96 and 98 begin to turn on and maintain a constant current level through FETs 14 and 16. CMIVR is extended as a result.

All current mirrors in this second embodiment of the present invention provide currents at outputs thereof which are approximately equal to the currents provided at the inputs thereof. However, in another embodiment of the present invention which is also illustrated by FIG. 3, the current provided at the output of current mirror 86 is slightly greater than the current at the input of current mirror 86. This permits a slightly greater amount of current to be sourced to FETs 48, 50, 96, and 98 than is sunk through FETs 80 and 52. This slight excess of current is diverted through P-channel FETs 96 and 98 even when current mirror outputs provided by FETs 78 and 80 are fully biased to conduct current. Consequently, FETs 96 and 98 continually conduct at least a slight amount of current and the impedance in current mirrors 100 and 106 never become extremely high. Thus, current mirrors 100 and 106 tend to remain unaffected by leakage currents which may be present in the device in which differential amplifier 10 is manufactured.

In summary, the CIMVR is extended in the second embodiment of the present invention because P-channel FETs 96 and 98 conduct current as FETs 20 and 22 begin to turn off in response to extremely negative common mode input voltages. In the first embodiment of the present invention discussed in connection with FIG. 2, the CIMVR is extended because the feedback signal provided to the gate of FET 52 compensates for a decreasing drain-to-source voltage across FET 52. The present invention additionally permits an increase in CMRR without reducing the CMIVR. In the second embodiment of the present invention discussed above in connection with FIG. 3, the CMRR is increased through the addition of a cascode stage in the outputs of current mirror 72. This cascode stage increases the impedance of near-constant current source 26. In the first embodiment of the present invention discussed above in connection with FIG. 2, the CMRR is increased without decreasing the CMIVR because FET 52 is adaptively biased so that it appears to present an increased impedance to FETs 20 and 22. Furthermore, the first embodiment of the present invention is particularly advantageous in permitting a high precision and low distortion output signal to be provided by amplifier 10 because it does not switch between P-channel and N-channel devices in order to obtain an extended CMIVR.

The foregoing description discusses preferred embodiments which may be changed or modified without departing from the scope of the present invention. For example, current mirrors such as those discussed herein can generally be modified by adding or removing cascode stages or by forming Wilson current mirrors, or the like. Those skilled in the art will be able to trade off the advantages and disadvantages of such modifications. Specifically, the removal of the cascode stage for current mirror 72 in FIG. 3 will have the effect of lowering the CMRR exhibited by differential amplifier 10 without degrading the CMIVR. Similarly, the cascode stage of current mirror 76 in FIG. 2 may be removed and amplifier 10 will experience only a slight degradation in input offset voltage. Moreover, those skilled in the art will recognize that feedback loop performance may be enhanced by adding additional stages and more sophisticated compensation. Still further, those skilled in the art will recognize that the FETs discussed herein may be replaced with bipolar, gallium arsnide, or other types of transistors or active devices, and that the P-channel and N-channel polarities discussed herein may be reversed. These and other changes and modifications obvious to those skilled in the art are intended to be included within the scope of the present invention.

What is claimed is:
1. A differential amplifier circuit comprising:
first and second current supply means configured so that current flowing through said first current supply means is proportional to current flowing through said second current supply means; a first active device having first and second nodes and having a control node, said first active device first node being coupled to said first current supply means; a second active device having first and second nodes and having a control node, said second active device first node being coupled to said second current supply means, and said first active device second node being coupled to said second active device second node;

modeling means, coupled to said first active device control node, for simulating current flowing through said first active device; and means coupled to said modeling means and at least one of said first and second active devices responsive to the simulated current through said modeling means for maintaining substantially constant currents flowing through said first and second current supply means.

2. An amplifier as claimed in claim 1 wherein said first and second current supply means are configured so that current flowing through said first current supply means substantially equals current flowing through said second current supply means.

3. An amplifier as claimed in claim 1 wherein said modeling means additionally couples to said second active device control node.

4. An amplifier as claimed in claim 3 wherein said modeling means comprises:
a first transistor having a control node coupled to said first active device control node and having first and second nodes; and
a second transistor having a control node coupled to said second active device control node, a first node coupled to said first transistor first node, and a second node coupled to said first transistor second node.

5. An amplifier as claimed in claim 1 wherein said means for maintaining comprises means, coupled to said first active device second node, for regulating current flow through said first and second active devices in a feedback loop that increases current flowing through said first and second active devices when current flowing through said modeling means decreases.

6. An amplifier as claimed in claim 5 wherein said modeling means comprises:
a first transistor having a control node coupled to said first active device control node and having first and second nodes; and
a second transistor having a control node coupled to said second active device control node, a first node coupled to said first transistor first node, and a second node coupled to said first transistor second node.

7. An amplifier as claimed in claim 6 wherein said modeling means additionally comprises a third transistor having a first node coupled to said first transistor second node, a control node coupled to said means for regulating current so that current flowing through said third transistor is proportional to current flowing through said means for regulating, and said third transistor having a second node.

8. An amplifier as claimed in claim 7 wherein said means for regulating comprises an active device having a first node coupled to said first active device second node, a control node coupled to said third transistor control node, and a second node coupled to said third transistor second node.

9. An amplifier as claimed in claim 1 wherein said maintaining means couples to the first node of said at least one of said first and second active devices, and the amplifier additionally comprises means, coupled to the second node of said first active device, for regulating a sum of the currents flowing through said first and second current supply means.

10. An amplifier as claimed in claim 9 wherein:
said modeling means comprises a third active device;
said first, second, and third active devices are each of a first polarity; and
said means for maintaining comprises a fourth active device of a second polarity coupled to the first node of said first active device and to said third active device so that current flow through said fourth active device increases as current flow through said third active device decreases.

11. An amplifier as claimed in claim 9 wherein said modeling means comprises:
a first transistor having a control node coupled to said first active device control node and having first and second nodes; and
a second transistor having a control node coupled to said second active device control node, a first node coupled to said first transistor first node, and a second node coupled to said first transistor second node.

12. An amplifier as claimed in claim 11 wherein said modeling means additionally comprises a third transistor having a first node coupled to the second nodes of said first and second transistors, a control node coupled to said regulating means so that current flowing in said third transistor is proportional to current flowing in said regulating means, and said third transistor having a second node.

13. An amplifier as claimed in claim 12 wherein said means for regulating comprises a third active device having a first node coupled to said first active device second node, a control node coupled to said third transistor control node, and a second node coupled to said third transistor second node.

14. A differential amplifier comprising:
a first current mirror having an input and having first and second outputs;
a first active device having a first node, having a second node coupled to said first current mirror first output, and having a control node;
a second active device having a first node, having a second node coupled to said first current mirror first output, and having a control node;
a third active device having a first node, having a second node coupled to said first current mirror second output, and having a control node coupled to a first one of said first and second active device control nodes;
a second current mirror having an input coupled to said second active device first node and an output coupled to said first active device first node;
a third current mirror having an input coupled to said third active device first node and having an output; and
a fourth active device having a control node coupled to said third current mirror output and a first node coupled to said first current mirror input.

15. An amplifier as claimed in claim 14 additionally comprising a fifth active device having a first node coupled to said third active device first node, a second node coupled to said third active device second node, and a control node coupled to a second one of said first and second active device control nodes.

16. An amplifier as claimed in claim 14 additionally comprising a capacitor coupled between said fourth active device control node and a terminal adapted to operate as an AC ground.

17. An amplifier as claimed in claim 14 wherein said first current mirror is configured so that the current at said first current mirror second output is less than the current at said first current mirror first output.

18. An amplifier as claimed in claim 17 wherein said third active device is configured to experience approximately the same current density as is experienced by said first and second active devices.

19. An amplifier as claimed in claim 14 additionally comprising:
a current source having an output for supplying current; and
a fourth current mirror having an input coupled to the output of said current source and an output coupled to the output of said third current mirror.

20. An amplifier as claimed in claim 19 wherein said fourth current mirror is configured so that the output thereof is provided by a cascode stage of said fourth current mirror.

21. An amplifier as claimed in claim 14 wherein:
said first current mirror is comprised of active devices exhibiting a first polarity;
said first, second and third active devices each exhibit said first polarity; and
said second and third current mirrors are each comprised of active devices which exhibit a second polarity.

22. An amplifier as claimed in claim 14 wherein said second and third current mirrors are each configured so that currents provided at the outputs thereof approximately equal currents at the inputs thereof.

23. A differential amplifier comprising:
a first current mirror having first, second, and third outputs;
a second current mirror having an input coupled to said first current mirror first output and having an output;
first and second active devices, each having first, second, and control nodes, said first and second active device second nodes being coupled together and to said first current mirror second output;
third and fourth active devices, each having first, second, and control nodes, said third and fourth active device control nodes being coupled to said first and second active device control nodes, respectively, and said third and fourth active device second nodes being coupled together and to said second current mirror output;
a fifth active device having a first node coupled to said second current mirror output, a second node coupled to said first current mirror third output, and a control node coupled to a first one of said first and second active device control nodes;
a third current mirror having an input and an output coupled to the first nodes of said first and second active devices, respectively;
a fourth current mirror having an input coupled to said third active device first node and an output coupled to said third current mirror output; and
a fifth current mirror having an input coupled to said fourth active device first node and an output coupled to said third current mirror input.

24. An amplifier as claimed in claim 23 additionally comprising a sixth active device having a first node coupled to said fifth active device first node, a second node coupled to said fifth active device second node, and a control node coupled to a second one of the control nodes of said first and second active devices.

25. An amplifier as claimed in claim 23 wherein:
said first current mirror is configured so that the current at each of said first, second, and third outputs of said first current mirror approximately equals the current at the other ones of said first, second, and third outputs of said first current mirror; and
said third, fourth, and fifth current mirrors are each configured so that currents generated at the outputs thereof approximately equals the currents at the inputs thereof, respectively.

26. An amplifier as claimed in claim 23 wherein said second current mirror is configured so that current generated at said second current mirror output is greater than current at said second current mirror input.

27. An amplifier as claimed in claim 23 wherein:
said first current mirror is configured so that said second and third outputs are provided by cascode stages of said first current mirror; and
said second current mirror is configured so that said second current mirror output is provided by a cascode stage of said second current mirror.

28. A differential amplifier circuit for extending common mode range, said amplifier comprising:
a differential input stage of said amplifier, said input stage having a signal input;
means for supplying a bias current in said differential input stage of said amplifier;
means for generating an image current which simulates said bias current in said differential input stage, said generating means being separate from said differential input stage and having an input coupled to said signal input of said differential input stage; and
means for controlling the bias current of said supplying means in response to the image current of said generating means to maintain said bias current at a substantially constant level.

29. An amplifier as claimed in claim 28 additionally comprising means for feeding the image current of said generating means back to said differential input stage to form a negative feedback loop so that said supplying means increases said bias current in response to a decrease in said image current.

30. An amplifier as claimed in claim 28 additionally comprising means for generating a constant current so that said image current generating means utilizes at least a portion of said constant current in generating said image current and said supplying means utilizes at least a portion of said constant current in response to a decrease in said image current.

31. A method of extending common mode range of a differential amplifier comprising the steps of:
supplying a bias current in a differential input stage of the differential amplifier;
generating an image current which simulates the bias current in the differential input stage, said generating occurring in a stage which is remote from said differential input stage and has an input coupled to an input of the differential input stage; and
controlling the bias current of said supplying step in response to the image current of said generating step to maintain the bias current at a substantially constant level.

32. A method as claimed in claim 31 additionally comprising the step of feeding the image current of said generating step back to the differential input stage to form a negative feedback loop so that said supplying step increases the bias current in response to a decrease in the image current.

33. A method as claimed in claim 31 additionally comprising the step of generating a constant current so that said generating an image current step utilizes at least a portion of said constant current in generating said image current and said supplying step utilizes at least a portion of said constant current in response to a decrease in said image current.

* * * * *